(12) United States Patent
Anderskouv et al.

(10) Patent No.: US 6,600,327 B1
(45) Date of Patent: Jul. 29, 2003

(54) METHOD OF REDUCING DISTORTION AND NOISE OF SQUARE-WAVE PULSES, A CIRCUIT FOR GENERATING MINIMALLY DISTORTED PULSES AND USE OF METHOD AND CIRCUIT

(75) Inventors: Niels Anderskouv, Dallas, TX (US); Lars Risbo, Copenhagen (DK)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/700,652

(22) PCT Filed: May 11, 1999

(86) PCT No.: PCT/DK99/00262

§ 371 (c)(1),
(2), (4) Date: Apr. 17, 2001

(87) PCT Pub. No.: WO99/59242

PCT Pub. Date: Nov. 18, 1999

(30) Foreign Application Priority Data

May 11, 1998 (DK) ................................................ 0642/98

(51) Int. Cl.[7] ............................................... G01R 29/26
(52) U.S. Cl. ......................... 324/613; 324/528; 324/691
(58) Field of Search ................................. 324/613, 528, 324/691; 363/78; 361/86

(56) References Cited

U.S. PATENT DOCUMENTS 3,692,987 A * 9/1972 Bos ............................. 324/613
4,929,886 A * 5/1990 Toshiyuki .................... 324/691
5,627,708 A * 5/1997 Lee .............................. 361/86

* cited by examiner

*Primary Examiner*—Christine K. Oda
(74) *Attorney, Agent, or Firm*—W. Daniel Swayze, Jr.; W. James Brady; Frederick J. Telecky, Jr.

(57) ABSTRACT

A method and apparatus of measuring current in a switching circuit (2) of the two-port type having a first set of terminals connected to a set of terminals of a noise reducing circuit, wherein a second set of terminals of the switching circuit has a switching terminal, which is adapted to be switched between the set of terminals of the noise reducing circuit, including the steps of providing an impedance in parallel with the switching circuit; measuring a current as a transient measurement during switching sequences in the switching circuit, the measurement being performed across an impedance in the noise reducing circuit.

14 Claims, 4 Drawing Sheets

METHOD OF REDUCING DISTORTION AND NOISE OF SQUARE-WAVE PULSES, A CIRCUIT FOR GENERATING MINIMALLY DISTORTED PULSES AND USE OF METHOD AND CIRCUIT

A method of measuring current in switched circuits, a circuit for measuring current, and use of the method and the circuit.

The invention relates to a method of measuring current in a switching circuit of the two-port type whose first set of terminals is connected to a set of terminals of a noise reducing circuit , wherein a second set of terminals of the switching circuit has a switching terminal, which is adapted to be switched between the set of terminals of the noise reducing circuit.

The invention moreover relates to a circuit for measuring current in a switching circuit of the two-port type whose first set of terminals is connected to a set of terminals of a noise reducing circuit, wherein the switching circuit has a second set of terminals having a switching terminal capable of being switched between the second set of terminals of the noise reducing circuit.

The invention finally relates to use of the method and the circuit.

Traditional current measurements in switched amplifiers require a resistor in the signal path to the load or to the power supply of the amplifier. Use of such a measuring resistor in a switched amplifier, consisting of a multiple of half bridges, used for audio amplification results in poorer audio performance and a lower overall efficiency of the amplifier. Furthermore the voltage measured over the resistor must be very small to obtain a low power loss, but the very low voltage yields a need of an measurement amplifier, and thereby a higher complexity of the audio amplifier, to amplify the signal before it can be used in standard audio amplifier circuits where circuit voltages up to 5 Volts are common. It is also known that switched amplifiers need a very fast reacting current protection system to prevent the amplifier from damage if the output is short circuited. This means that the current measuring circuit must be very fast i.e. have a high bandwidth. If the current measuring circuit is based on a measuring resistor and a measuring amplifier with a high gain it is known from earlier designs that it is a complicated task to realise a high bandwidth of the circuit at the same time.

On the other hand switched amplifiers need to be protected against destructive high and fast rising currents for example due to short circuiting of the amplifiers output. Therefore it has long been attempted to find a principle to measure the current which allows the current to be measured without the above mentioned drawbacks.

The principle of a switched amplifier is that two or more switches in a half-bridge or a multiple thereof is switched to conduct and non-conduct, respectively, for a period of time, depending on the amplitude of a signal, such as an audio signal, fed to the amplifier. The information in the audio signal is hereby converted into a plurality of pulses (the signal is pulse-modulated) which carefully correspond to the useful information of the audio signal. To ensure a good linearity of the switched amplifier the pulses need to be very well defined.

Pulse-modulated amplifiers are in theory very linear and have low power losses, with a low distortion and an efficiency of 100%, but it has been found in practice that unlinearities and much lower efficiencies have caused them to be unsuitable for use in High Fidelity amplifiers, the reason being primarily that it is not practically possible to provide ideal pulses, high efficiency and high reliability of the amplifier at the same time.

One of the reasons why the pulses cannot be generated ideally is to be found in the power supply of the switches. The pulse heights vary as a consequence of variations in the power supply voltage, and therefore it is desirable to have a very well defined power supply voltage, but it is not possible to obtain a well defined power supply voltage with a measuring resistor inserted between the power supply and the switched amplifier output stage, due to the varying voltage over the measuring resistor when current is drawn.

It is more over seen that if a measuring resistor is inserted between the output stage and the load, the output impedance of the amplifier will rise. In amplifiers with feedback it is possible to decrease the output impedance of the amplifier by increasing the feedback, but in open loop or limited feedbacked amplifiers like true digital amplifiers and switched amplifiers in general this is not obtainable.

Furthermore it is seen that the efficiency of the amplifier will decrease if a resistor is inserted in the signal path either if it is between the output stage and the power supply or the load, due to current losses in the resistor. In prior used amplifiers of class A and AB types, this has been accepted as a minor source to the losses, due the low efficiency of the amplifiers output stages. But in switched amplifiers where extremely high efficiencies are obtainable the power losses in a measuring resistor can easily increase the total power losses of the amplifier with more than 50%.

In prior art there has been put a lot of effort in reducing the current-losses in the measuring resistance, among the presented solutions, a resistor with a very low resistance has been used, this of course results in a low voltage over the measuring resistance that needs to be amplified by a high gained measuring amplifier before it can be used in circuits operating at voltage levels of up to 5 volts. High gained amplification of very small voltages can be obtained, with limited bandwidths, in low noise circuits like class A and class AB amplifiers, but it is very difficult to obtain even a limited bandwidth amplified signal in the environment of a switched amplifier, due to noise generated by very fast slew rates on voltage and current sources in the amplifier. As mentioned earlier there is a need for fast reacting current protection systems in switched amplifiers due to the nature of the output stage therefore it has been seen in earlier designs that the current measuring circuits have been realised with a measuring resistor with higher resistance and thereby higher losses.

Accordingly, an object of the invention is to provide a method which is capable of measuring the current in a switched amplifier output stage and provide the measured signal with a high bandwidth at the desired voltage level, without the use of a measuring resistor in the signal path of the amplifier and without the need of an amplifier circuit to amplify the measured signal.

The object of the invention is achieved by the method defined in the introductory portion of claim 1, which is characterised in in that the current measurement is performed as a transient measurement during the switching sequences in the switching circuit, and that the measurement is performed across an impedance in the noise reducing circuit, said impedance being provided in parallel with the switching circuit.

A circuit is hereby provided which makes it possible to obtain a useful current sensor signal at the desired voltage level, without adding a loss and distortion generating current measuring resistor either in the output terminal or in the power supply terminal of the switched circuit.

Expedient embodiments of the method are defined in claims 2 and 3.

As mentioned, the invention also relates to a circuit of the type defined in the introductory portion of claim 4.

This circuit is characterized in that the current in the switching circuit during the switching sequence is caused to run in a measuring impedance circuit in the noise reducing circuit.

Expediently, as stated in claim 5, that the measuring impedance circuit is formed by an inductance which is connected between a terminal of the the first set of terminals of the switching circuit and a terminal of an input port of the noise reducing circuit, and in that a series connection of a capacitor and a measuring resistor is connected in parallel with the first set of terminals of the switching circuit.

When, as stated in claim 9 that the measured current is fed to a control circuit which is adapted to instantaneously switch off the switching terminal of the switching circuit, the additional effect is achieved that the control circuit can instantaneously disconnect the switches at a predetermined current value, so that these are protected against destruction by excess current.

Other expedient embodiments of the circuit are defined in the dependent claims.

Finally, as mentioned, the invention relates to use of the method and the circuit.

This use is defined in claim 12.

In this use it is possible to provide a low-noise half-bridge for audio use which has a low pulse distortion, as well as a much simpler and quicker protection of the switches than traditional protecting circuits for half-bridges.

It should be noted that the principles of the invention are extremely suitable for use in connection with a noise attenuating circuit, which is described more fully in WO 99/59241 filed with the same priority as the present application.

The invention will now be explained more fully with reference to an embodiment of the invention shown in the drawing, in which FIG. 1 shows the basic structure of the invention in block diagram form, FIG. 2 shows possible uses of the invention in block diagram form, FIG. 3 shows an embodiment, by way of example, with a passive noise attenuating and current sensor circuit, in diagram form, FIG. 4 shows an example of another embodiment of the invention in diagram form, and FIG. 5 shows voltages in and around the switched circuit during connection and disconnection of the switches.

Figure 1:
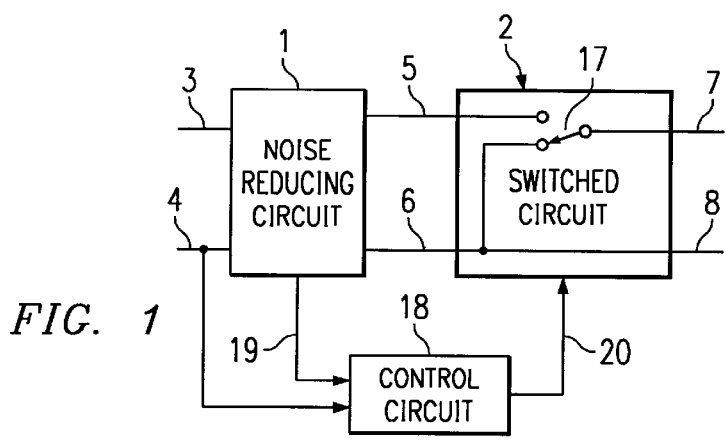

In FIG. 1, the numeral 1 designates a noise reducing circuit whose terminals 5 and 6 are connected to the terminals of one port of a switched circuit 2 of the two-port type. The other port of the switched circuit has two terminals 7, 8, of which one switching terminal 17 may be switched between the terminals 5 and 6, while the other terminals 8 is connected to the terminal 6. The noise reducing circuit, cf. the following, has facilities which is capable of measuring the current in the switched circuit, and an output 19 in which a signal following the current in the switched circuit is present. This output 19 is connected to a control circuit 18 which is capable of breaking the switches in the switched circuits 2 very quickly via an output 20.

Figure 2:
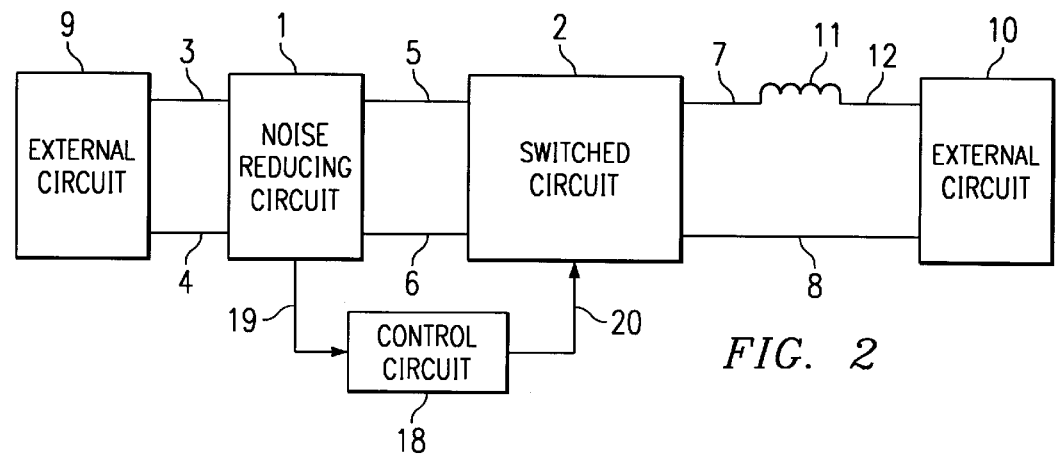

FIG. 2 shows a basic example of how the noise reducing circuit 1, the control circuit 18 and the switched circuit 2 may be connected to external circuits 9 and 10. One external circuit 9 is connected to the terminals 3 and 5 of the noise reducing circuit, and the other external circuit 10 is connected via a terminal 8 and an inductance 11 to the terminal 7 of the switched circuit. The external circuits 9 and 10 may be formed by a voltage supply and a load, respectively. The external circuits 9 and 10 may alternatively be formed by a load and a voltage supply, respectively.

Figure 3:
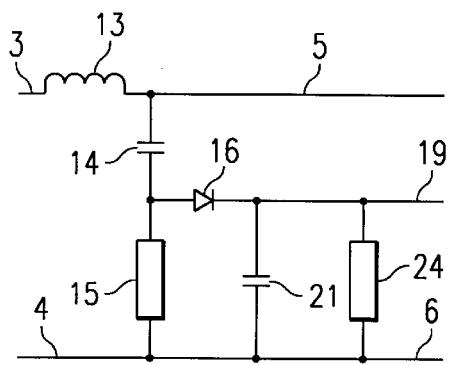

FIG. 3 shows an example of how the noise reducing circuit 1 may be realised. The noise reducing circuit 1 has an inductance 13, which is inserted between the terminals 3 and 5, and a series coupling of a capacitor 14 and a measuring resistor 15. A current measuring circuit consisting of a diode 16, a measuring capacitor 21 and a resistor 24 is inserted in parallel with the measuring resistor 15. The anode of the diode 16 is connected to the common point between the measuring resistor 15 and the capacitor 14, and its cathode is connected to a terminal 19 and the one terminal of the measuring capacitor 21, while the other terminal of the measuring capacitor is connected to the terminal 6. A resistor 24 is inserted in parallel with the measuring capacitor 21 and serves to discharge the measuring capacitor 21 with a suitable time constant. The measuring signal is thus provided across the measuring capacitor 21 and the resistor 24 as a differential signal between the terminals 6 and 19. The measuring signal may be provided with opposite polarity by inserting the diode with an opposite direction of conduction.

Figure 4:
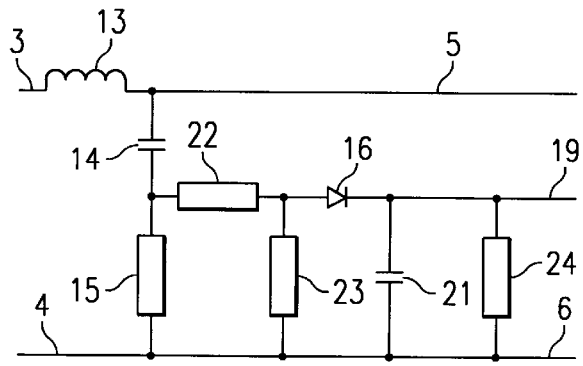

FIG. 4 shows another example of how the noise reducing circuit 1 may be realized. The noise reducing circuit 1 has an inductance 13 which is inserted between the terminals 3 and 5, and a series coupling of the capacitor 14 and the measuring resistor 15. A current measuring circuit consisting of the diode 16, the measuring capacitor 21 and the resistors 22, 23 and 24 is inserted in parallel with the measuring resistor 15. The resistors 22 and 23 are inserted in a series coupling between the common point of the measuring resistor 15 and the capacitor 14 and the terminal 6. The anode of the diode 16 is connected to the common point between the resistors 22 and 23, while its cathode is connected to the terminal 19 and the one terminal of the measuring capacitor 21. The other terminal of the capacitor is connected to the terminals 4 and 6. The resistor 24 is inserted in parallel with the measuring capacitor with the purpose of discharging the measuring capacitor with a suitable time constant. The measuring signal is thus provided across the measuring capacitor 21 and the resistor 24 as a differential signal between the terminals 6 and 19. The measuring signal may be provided with opposite polarity by inserting the diode with an opposite direction of conduction.

Figure 5:
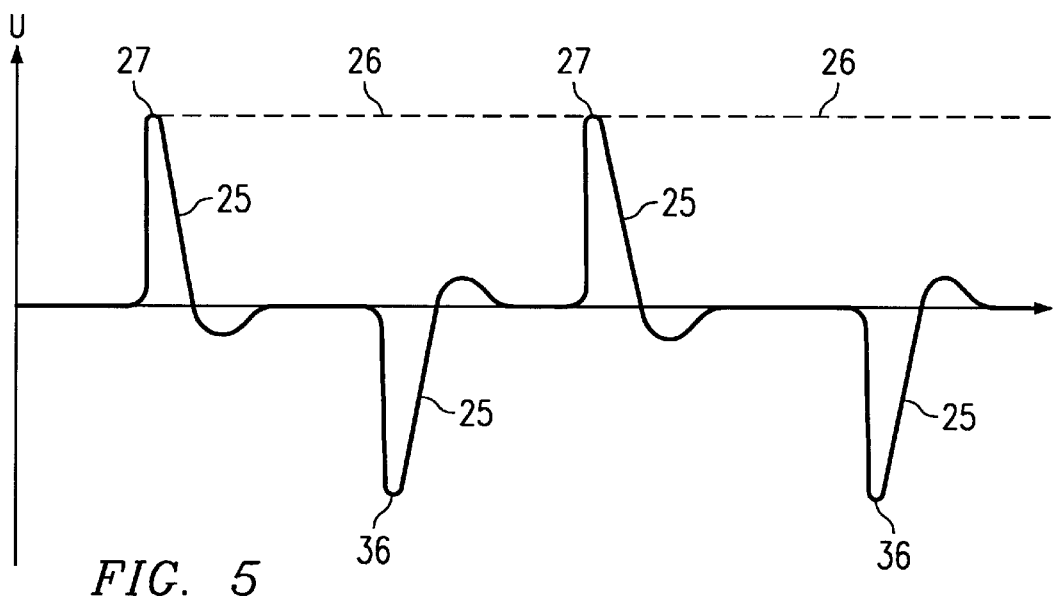

FIG. 5 shows an example of how the voltage 25 across the measuring resistor 15 may be during the switching sequences. The voltage peaks 27 are given by the current in the switched circuit 2, multiplied by the value of the resistor 15 when the switchting terminal 17 is switched from the terminal 6 to the terminal 5 at a positive current into the terminal 7. The voltage peaks 36 are given by the current in the switched circuit 2 multiplied by the value of the resistor 15 when the switching terminal 17 is switched from the terminal 5 to the terminal 6 at a positive current into the terminal 7. The numeral 26 designates the course of the voltage across the measuring capacitor 21, and it will be seen that the mean voltage across the measuring capacitor assumes a value which is proportional to the peak current in the measuring resistor.

Figure 6:
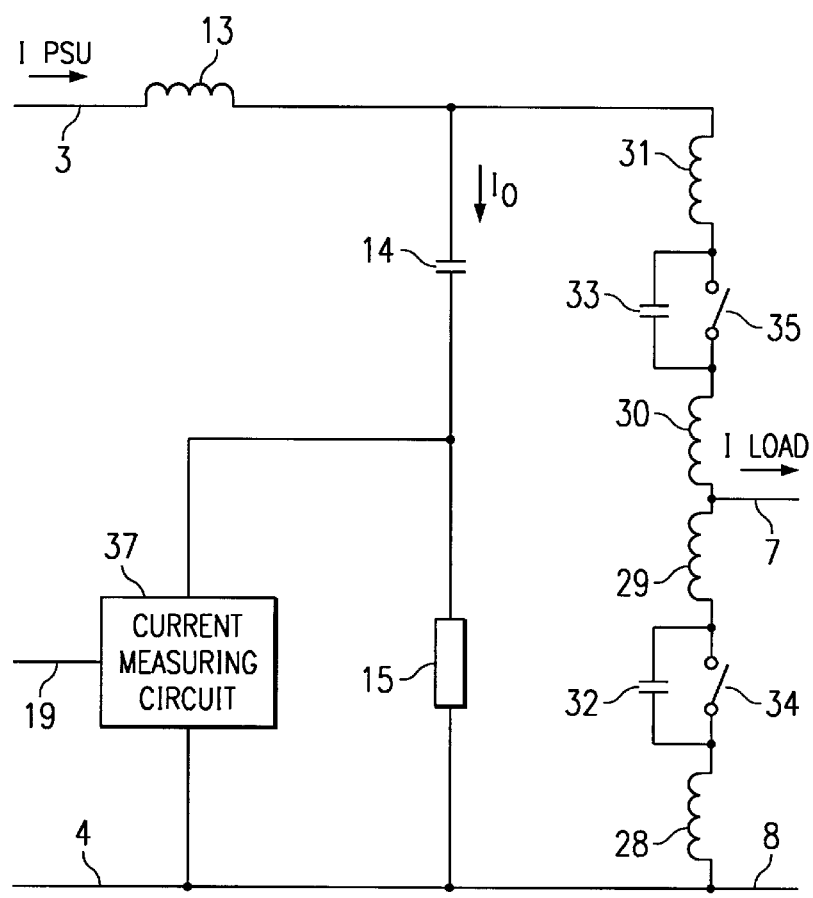
FIG. 6 shows an embodiment of the circuits 1, 2 and 18 in FIG. 1 or 2.

FIG. 6 shows an example of how the circuits 1 and 2 in FIG. 1 or 2, may be realised where the load can be connected between the terminals 7 and 8 and the power supply can be connected between the terminals 3 and 4. The current measuring circuit 37, consisting of the components 22, 23, 16, 21 and 24, is connected in parallel with the resistor 15 where terminal 4 is common ground of circuit; 1 and 37 and terminal 19 provides a voltage proportional to the peak current running in the resistor 15.

The current flow in the circuits 1 and 2 will now be explained with reference ti FIGS. 7a–7g in more detail, in order to show how the current measuring can be done.

Thus FIGS. 7a–7g illustrates current flow graphs of the circuits 1 and 2 where the current flow graphs are split into six states of the circuits 1 and 2, as shown in FIGS. 7a to 7g. The current measuring circuit 37 is assumed to have no influence on the current flow in circuit 1 and 2 and is therefore not pictured.

Figure 7A:
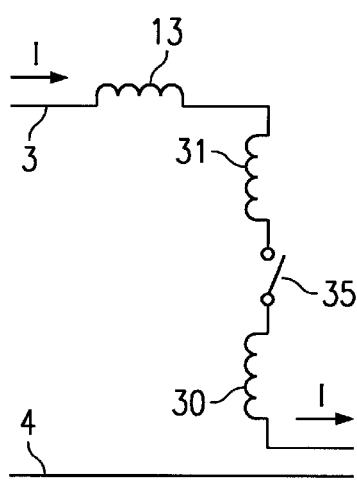
FIG. 7a–7g shows different states of current flows in the circuits of FIG. 6.

FIG. 7a shows a state where the switch 35 is conducting a positive load current and the current is running in the snubber inductor 13 and the two parasitic inductors 30 and 31.

Figure 7B:
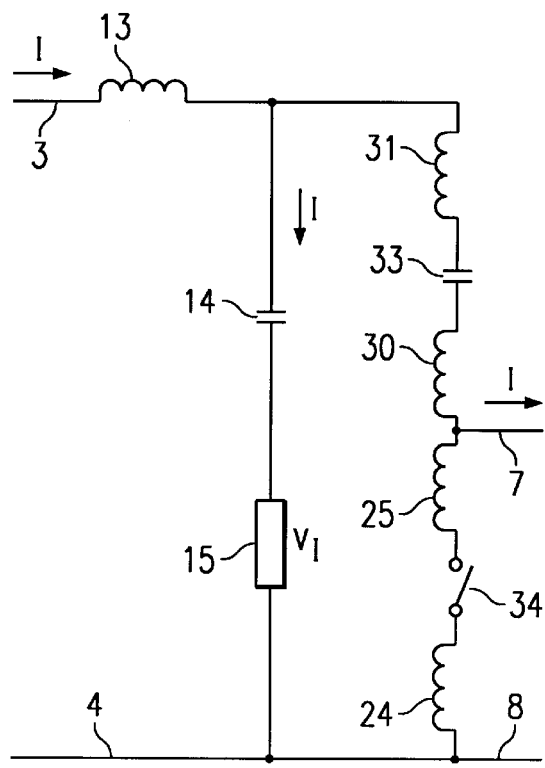

FIG. 7b shows the circuits 1 and 2 where the switch 35 just have been switched off and the switch 34 just have been switched on, due to that the current running in the snubber inductor 13 and the currents running in the parasitic inductors 30 and 31 can not change simultaneously the currents will run in the capacitor 14 and the resistor 15 until the contained energies in the inductors 13, 30 and 31 is zero. In realised designs of the circuits 1 and 2 will the energy contained by the inductor 13 be much greater than the energy contained by the inductors 30 and 31 and therefore will the current running in the inductor 13 run in the resistor 15 for a longer time, which is shown in FIG. 7c.

Figure 7C:
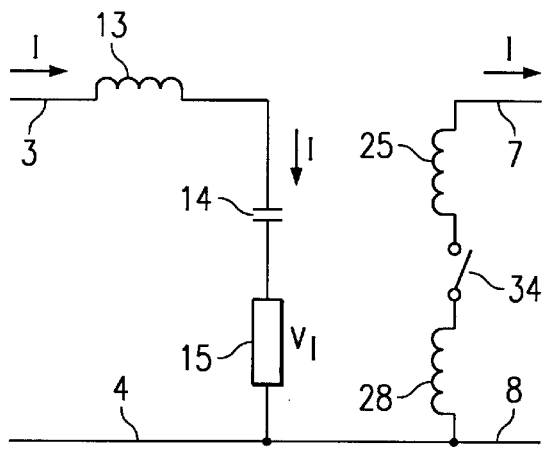

FIG. 7c shows the circuits 1 and 2 right after the energy in the parasitic inductors is zero and it is seen that load current is running through the switch 34 and its parasitic inductance's 28 and 29. Furthermore it is seen that the current that was in the inductor 13 still is running in the capacitor 14 and the resistor 15 until the energy in the inductor 13 is zero. It is thereby seen that the current running in inductor 13 primarily is setting the voltage over the resistor 15 and due to the fact that the current in the inductor just before switching of the load was equal to the load current the peak voltage generated over resistor 15 will be proportional to the load current. By choosing the right values of the components 16, 21, 22, 23 and 24 in the current measuring circuit 37 it is possible to obtain a voltage at terminal 19 at a desired level and bandwidth that is proportional to the load current. It should be noticed that the voltage over the resistor 15 have the same sign as the load current when using the definitions given in FIG. 7.

Figure 7D:
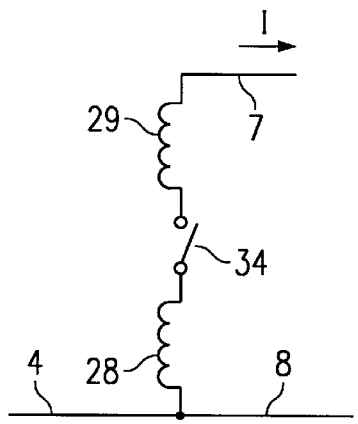

FIG. 7d shows the circuits 1 and 2 in a state where the switching from switch 35 to switch 34 is finished and 34 is conducting a positive load current and the current is running in the switch 34 itself and in the two parasitic inductors 28 and 29.

Figure 7E:
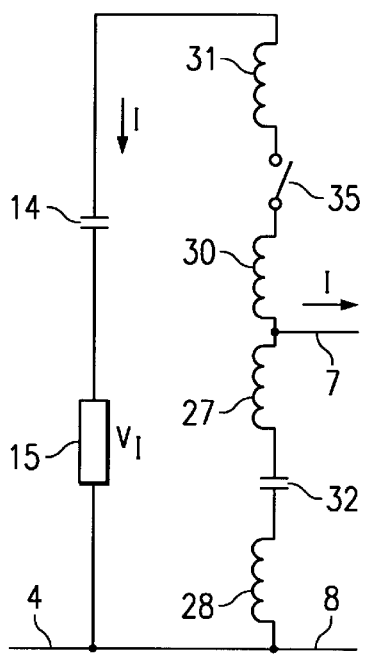

FIG. 7e shows the current flow in the circuit 1 and 2 under the switching of the load from switch 34 to switch 35 and it is seen that the current from the load is running in the capacitor 14 and the resistor 15. It should be noticed that the voltage over the resistor 15 have the opposite sign as the load current when using the definitions given in FIG. 7.

Figure 7F:
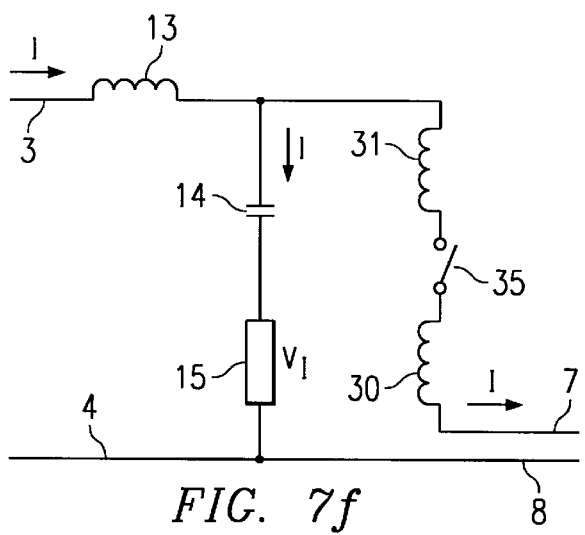

FIG. 7f shows the current flow in the circuit 1 and 2 after the switching from switch 34 to switch 35 is done and the load current is taken over from the capacitor 14 and the resistor 15 by the snubber inductor 13.

Figure 7G:
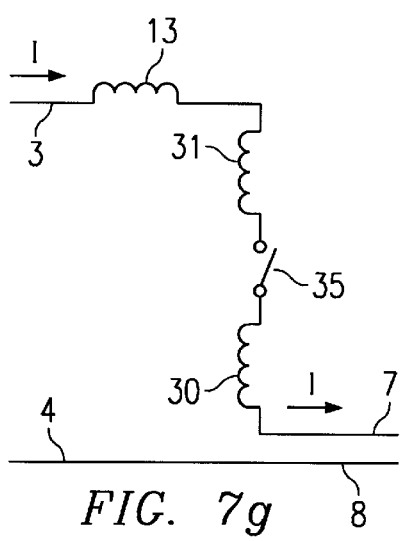

FIG. 7g shows the following current flow of the circuits 1 and 2 and it is seen that the current flow is identical to the one pictures in FIG. 7a and the current flow graph is completed.

As will be appreciated from the foregoing, the invention provides a noise reducing circuit which measures load current and protects the semiconductors in a switched current against excess currents, it being possible for the noise attenuating circuit to be of very low complexity.

What is claimed is:

1. A method of measuring current in a switching circuit (2) having a first set of terminals connected to a set of terminals (5,6) of a noise reducing circuit (1), wherein a second set of terminals (7,8) of the switching circuit (2) has a switching terminal (17), which is adapted to be switched between the set of terminals (5,6) of the noise reducing circuit, comprising the steps of providing an impedance in parallel with the switching circuit; measuring a current as a transient measurement during switching sequences in the switching circuit, the measurement being performed across said impedance in the noise reducing circuit, wherein a voltage supply is applied to an input port (3,4) of the noise reducing circuit, and said inductance (11) in series with a load circuit (10) is inserted between the said second set of terminals (7,8) of the switching circuit having the switching terminal (17).

2. A method of measuring current in a switching circuit (2) having a first set of terminals connected to a set of terminals (5,6) of a noise reducing circuit (1), wherein a second set of terminals (7,8) of the switching circuit (2) has a switching terminal (17), which is adapted to be switched between the set of terminals (5,6) of the noise reducing circuit, comprising the steps of providing an impedance in parallel with the switching circuit; measuring a current as a transient measurement during switching sequences in the switching circuit, the measurement being performed across said impedance in the noise reducing circuit, wherein a load circuit (9) is inserted to an input port of the noise reducing circuit (1) and an inductance (11) and a voltage supply are series coupled and applied to the second set of terminals (7,8) having the switching terminal (17).

3. A circuit for measuring current in a switching circuit (2) comprising a first set of terminals is connected to a set of terminals (5,6) of a noise reducing circuit (1), wherein the switching circuit (2) including a second set of terminals (7,8) having a switching terminal (17) capable of being switched between the second set of terminals (5,6) of the noise reducing circuit current in the switching circuit during the switching sequence being caused to run in a measuring impedance circuit in the noise reducing circuit, wherein the measuring impedance circuit is formed by an inductance (13) which is connected between a terminal (5) of the first set of terminals of the switching circuit and a terminal (3) of an input port of the noise reducing circuit, and a series connection of a capacitor (14) and a measuring resistor (15) is connected in parallel with the first set of terminals (5,6) of the switching circuit.

4. A circuit according to claim 3, the transient voltage across the measuring resistor (15) during connection and disconnection by the switching terminal (17) is rectified by a diode (16), having one terminal connected to the common point between the measuring resistor (15) and the capacitor (14), and another terminal connected to ground via a measuring capacitor (21).

5. A circuit according to claim 4 wherein a voltage divider (5,23) to ground is inserted between the measuring resistor (15) and the diode (16).

6. A circuit according to claim 5 wherein the measured current is fed to a control circuit (18) which is adapted to instantaneously switch off the switching terminal (17) of the switching circuit.

7. A circuit according to claim 4 a resistor is inserted before or after the diode.

8. A circuit according to claim 7 wherein the measured current is fed to a control circuit (18) which is adapted to instantaneously switch off the switching terminal (17) of the switching circuit.

9. A circuit according to claim 3 wherein the measured current is fed to a control circuit (18) which is adapted to instantaneously switch off the switching terminal (17) of the switching circuit.

10. The circuit of claim 4 wherein a voltage divider to ground is inserted between the diode and the measuring capacitor.

11. A circuit according to claim 3 wherein the noise reducing circuit and the switching circuit are formed as an integrated unit on a substrate.

12. A circuit according to claim 11, wherein a conductor path on the integrated unit forms the inductive component of the circuit.

13. A circuit according to claim 3 wherein the measured current is fed to a control circuit (18) which is adapted to instantaneously switch off the switching terminal (17) of the switching circuit.

14. A circuit according to claim 4 wherein the measured current is fed to a control circuit (18) which is adapted to instantaneously switch off the switching terminal (17) of the switching circuit.

* * * * *